(12) United States Patent
Higashijima et al.

(10) Patent No.: US 9,355,871 B2
(45) Date of Patent: May 31, 2016

(54) SUBSTRATE LIQUID PROCESSING APPARATUS FOR SEPARATING PROCESSING SOLUTION AND ATMOSPHERE FROM EACH OTHER WITHIN COLLECTION CUP

(75) Inventors: Jiro Higashijima, Koshi (JP); Norihiro Ito, Koshi (JP); Nobuhiro Ogata, Koshi (JP); Shuichi Nagamine, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 993 days.

(21) Appl. No.: 13/541,831

(22) Filed: Jul. 5, 2012

(65) Prior Publication Data

US 2013/0008872 A1   Jan. 10, 2013

(30) Foreign Application Priority Data

Jul. 6, 2011  (JP) ................................. 2011-150310
Apr. 25, 2012  (JP) ................................. 2012-099434

(51) Int. Cl.
*H01L 21/67* (2006.01)
*H01L 21/00* (2006.01)
*B08B 3/00* (2006.01)
*B08B 3/04* (2006.01)
*B05B 15/04* (2006.01)
*B05C 11/08* (2006.01)
*B08B 15/02* (2006.01)
*B08B 3/08* (2006.01)
*G03F 7/40* (2006.01)

(52) U.S. Cl.
CPC ...... *H01L 21/67017* (2013.01); *B05B 15/0406* (2013.01); *B05C 11/08* (2013.01); *H01L 21/6708* (2013.01); *H01L 21/6715* (2013.01); *H01L 21/67051* (2013.01); *B08B 3/04* (2013.01); *B08B 3/08* (2013.01); *B08B 15/02* (2013.01); *G03F 7/40* (2013.01)

(58) Field of Classification Search
None
See application file for complete search history.

(56) References Cited

U.S. PATENT DOCUMENTS

| | | | |
|---|---|---|---|
| 2004/0050491 A1* | 3/2004 | Miya et al. | 156/345.11 |
| 2007/0163711 A1* | 7/2007 | Koo et al. | 156/345.1 |
| 2007/0245954 A1* | 10/2007 | Collins | H01L 21/67017 118/326 |
| 2008/0142051 A1* | 6/2008 | Hashizume | 134/23 |
| 2012/0260946 A1* | 10/2012 | Ogata et al. | 134/18 |

FOREIGN PATENT DOCUMENTS

| | | | |
|---|---|---|---|
| JP | 09-064009 A | | 3/1997 |
| JP | 2000183010 A | * | 6/2000 |
| JP | 2000-315671 A | | 11/2000 |
| JP | 2007-311446 A | | 11/2007 |
| JP | 2007311446 A | * | 11/2007 |
| TW | 200629357 A | | 8/2006 |

* cited by examiner

*Primary Examiner* — Binu Thomas
(74) *Attorney, Agent, or Firm* — Pearne & Gordon LLP

(57) ABSTRACT

A substrate liquid processing apparatus is provided, in which a processing solution and an atmosphere can be separated from each other within a collection cup. The substrate liquid processing apparatus includes: a substrate rotation unit; a processing solution supply unit; a collection cup configured to collect the processing solutions; liquid collection regions formed at the collection cup; a liquid drain opening formed at a bottom portion of the collection cup; an exhaust opening formed above the liquid drain opening; a fixed cover configured to cover an upper portion of the exhaust opening with a space therebetween; an elevating cup provided above the fixed cover and configured to guide the processing solutions into the liquid collection regions; and a cup elevating unit configured to move up and down the elevating cup depending on the kinds of the processing solutions.

8 Claims, 4 Drawing Sheets

SUBSTRATE LIQUID PROCESSING APPARATUS FOR SEPARATING PROCESSING SOLUTION AND ATMOSPHERE FROM EACH OTHER WITHIN COLLECTION CUP

CROSS-REFERENCE TO RELATED APPLICATION

This application claims the benefit of Japanese Patent Application Nos. 2011-150310 and 2012-099434 filed on Jul. 6, 2011 and Apr. 25, 2012, respectively, the entire disclosures of which are incorporated herein by reference.

FIELD OF THE INVENTION

The present disclosure relates to a substrate liquid processing apparatus and a substrate liquid processing method for processing a substrate with a processing solution.

BACKGROUND OF THE INVENTION

Conventionally, when manufacturing a semiconductor component or a flat panel display, in order to perform a cleaning process or an etching process onto a substrate such as a semiconductor wafer or a liquid crystal substrate, there has been employed a substrate liquid processing apparatus capable of performing a liquid process with multiple kinds of processing solutions such as a cleaning solution, an etching solution, and a rinse solution.

The substrate liquid processing apparatus includes a substrate processing chamber within a housing. The substrate processing chamber includes a substrate rotation unit for holding and rotating the substrate; a processing solution supply unit for supplying a processing solution on the substrate; and a processing solution collection unit for collecting the processing solution.

The processing solution collection unit includes a collection cup surrounding the substrate. The collection cup includes discharge openings connected to a gas-liquid separation device.

In the substrate liquid processing apparatus, the processing solution supply unit supplies the processing solution on the rotating substrate, and the collection cup collects the processing solution dispersed around the substrate and an atmosphere around the substrate by centrifugal force caused by the rotation of the substrate. The collected processing solution and atmosphere are transferred to the gas-liquid separation device through the discharge openings, and separated into the processing solution in a liquid form and the atmosphere in a gaseous form by the gas-liquid separation device to be individually discharged to the outside (see, for example, Patent Document 1).

Patent Document 1: Japanese Patent Laid-open Publication No. H9-64009

However, in the conventional substrate liquid processing apparatus, the discharge openings of the collection cup are connected to the gas-liquid separation device. Thus, it is required to provide the gas-liquid separation device in addition to the collection cup. Therefore, the substrate liquid processing apparatus may be scaled up.

In particular, in the substrate liquid processing apparatus, liquid processes are performed on the substrate with multiple kinds of processing solutions depending on a type of the liquid processes. Thus, if the multiple kinds of processing solutions are selectively supplied to the substrate, a multiple number of gas-liquid separation devices corresponding to the multiple kinds of processing solutions are required. Therefore, the substrate liquid processing apparatus may be further scaled up.

BRIEF SUMMARY OF THE INVENTION

In accordance with one aspect of an illustrative embodiment, there is provided a substrate liquid processing apparatus configured to perform a liquid process on a substrate with a processing solution. The substrate liquid processing apparatus includes a substrate rotation unit configured to hold and rotate a substrate within a processing space; a processing solution supply unit configured to selectively supply multiple kinds of processing solutions to the substrate; a collection cup configured to collect the processing solutions supplied to the substrate; a multiple number of liquid collection regions formed at the collection cup and configured to collect the processing solutions; at least one liquid drain opening formed at a bottom portion of the collection cup and configured to discharge the processing solutions collected in the liquid collection regions; at least one exhaust opening formed above the at least one liquid drain opening of the collection cup; at least one fixed cover provided at the collection cup and configured to cover an upper portion of the at least one exhaust opening with a certain space therebetween; at least one elevating cup provided above the at least one fixed cover and configured to guide the processing solutions supplied to the substrate into the liquid collection regions; and at least one cup elevating unit configured to move up and down the at least one elevating cup depending on the kinds of the processing solutions.

The at least one liquid drain opening may be plural in number, and the liquid drain openings may be respectively formed at bottom portions of the liquid collection regions. Further, the number of the liquid drain openings may correspond to the number of the kinds of the processing solutions supplied from the processing solution supply unit.

The at least one cup elevating unit may move up and down the at least one elevating cup, so that the processing space communicates with one of the liquid drain openings.

At least one supporting protrusion provided at the at least one fixed cover may be covered by at least one supporting recess provided at the at least one elevating cup.

When the at least one elevating cup is moved up, a lower end of the at least one supporting recess may be positioned to be lower than an upper end of the at least one fixed cover.

At least one cover member protruding toward an upper area and a side area of the at least one exhaust opening may be provided at the at least one fixed cover.

The at least one exhaust opening may be plural in number, and the exhaust openings may communicate with each other at a bottom portion of the collection cup.

The at least one exhaust opening may be provided between adjacent the liquid collection regions.

The liquid collection regions may be partitioned by at least one partition wall at which the at least one exhaust opening is formed.

In accordance with another aspect of the illustrative embodiment, there is provided a substrate liquid processing method for performing a liquid process on a substrate with a processing solution. The substrate liquid processing method includes selectively supplying plural kinds of processing solutions to a rotating substrate within a processing space; collecting the processing solutions supplied to the substrate by using a collection cup; discharging the processing solutions collected in at least one liquid collection region of the collection cup through at least one liquid drain opening and exhausting a gas through an exhaust opening provided above the at least one liquid drain opening; and moving up and down an elevating cup depending on the kinds of the processing solutions with respect to a fixed cover provided above the exhaust opening with a certain space therebetween.

The at least one liquid drain opening may be plural in number, and the processing solutions may be discharged through the liquid drain openings corresponding to the kinds of processing solutions supplied from a processing solution supply unit.

The processing space may communicate with one of the liquid drain openings by moving up and down the elevating cup.

When the elevating cup is moved up, a lower end of the elevating cup may be positioned to be lower than an upper end of the fixed cover.

In accordance with the illustrative embodiment, the processing solution and the atmosphere can be separated from each other within the collection cup, and the gas-liquid separation device is not required additionally. Therefore, even if multiple kinds of processing solutions are selectively supplied to the substrate depending on types of the liquid processes performed on the substrate, the substrate liquid processing apparatus can be miniaturized.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, a substrate liquid processing apparatus and a substrate liquid processing method using the substrate liquid processing apparatus will be explained in detail with reference to the accompanying drawings.

Figure 1:
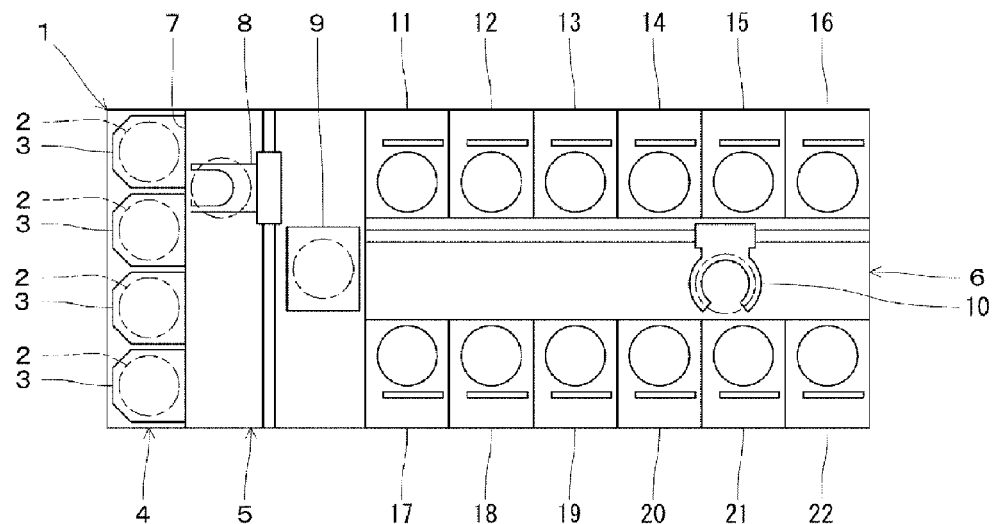
FIG. 1 is a plane view illustrating a substrate liquid processing apparatus.

As depicted in FIG. 1, a substrate liquid processing apparatus 1 includes a substrate loading/unloading section 4; a substrate transfer section 5; and a substrate processing section 6. The substrate loading/unloading section 4 is configured to load and unload a multiple number of, e.g., 25, substrates 2 (herein, semiconductor wafers) as processing target objects to and from a carrier 3 at a front end portion of a substrate liquid processing apparatus 1. Further, the substrate transfer section 5 is arranged at a rear of the substrate loading/unloading section 4 and configured to transfer the substrates 2 accommodated in the carrier 3. Furthermore, the substrate processing section 6 is arranged at the rear of the substrate transfer section 5 and configured to perform various processes, such as a cleaning process and a drying process, on the substrates 2.

The substrate loading/unloading section 4 includes the four carriers 3 at regular intervals in left and right directions while the four carriers 3 are in close contact with a front wall 7 of the substrate transfer section 5.

The substrate transfer section 5 includes a substrate transfer device 8 and a substrate transfer table 9 therein. The substrates 2 are transferred between any one of the carriers 3 placed in the substrate loading/unloading section 4 and the substrate transfer table 9 by using the substrate transfer device 8.

The substrate processing section 6 includes a substrate transfer device 10 at a central portion thereof and substrate processing chambers 11 to 22 arranged back and forth at left and right sides of the substrate transfer device 10.

In the substrate processing section 6, further, each of the substrates 2 is transferred between the substrate transfer table 9 of the substrate transfer section 5 and each of the substrate processing chambers 11 to 22 by using the substrate transfer device 10. Then, each of the substrates 2 is processed in each of the substrate processing chambers 11 to 22.

Figure 2:
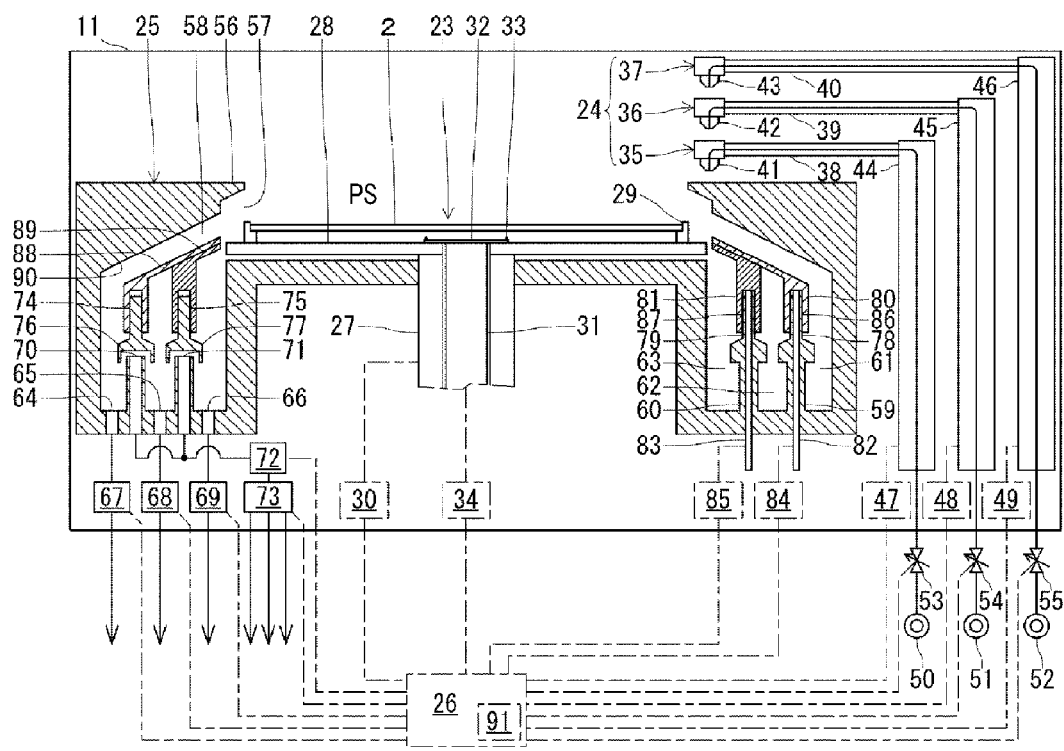
FIG. 2 is a schematic view illustrating a substrate processing chamber.

The substrate processing chambers 11 to 22 have the same configuration, and, thus, a configuration of the substrate processing chamber 11 will be explained as a representative example. As depicted in FIG. 2, the substrate processing chamber 11 includes a substrate rotation unit 23 configured to horizontally hold and rotate the substrate 2 within a processing space to be described later; a processing solution supply unit 24 configured to selectively supply a multiple number of processing solutions on an upper surface of the substrate 2 rotated by the substrate rotation unit 23; and a processing solution collection unit 25 configured to collect the processing solutions supplied on the substrate 2 by the processing solution supply unit 24. The substrate rotation unit 23, the processing solution supply unit 24, and the processing solution collection unit 25 are controlled by a controller 26. Further, the controller 26 controls the whole substrate liquid processing apparatus 1 including the substrate transfer devices 8 and 10.

In the substrate rotation unit 23, a circular ring-shaped table 28 is horizontally provided on an upper end portion of a rotation shaft 27 in a hollow cylinder shape, and a multiple number of substrate holding members 29 for horizontally holding the substrate 2 are provided at a periphery of the table 28 at regular intervals along a circumference thereof. The substrate holding members 29 are in contact with the periphery of the substrate 2. The rotation shaft 27 is connected to a rotation driving device 30. The rotation shaft 27 and the table 28 are rotated by the rotation driving device 30, so that the substrate 2 held by the substrate holding members 29 on the table 28 is also rotated. The rotation driving device 30 is connected to the controller 26, and its rotating operation is controlled by the controller 26.

In the substrate rotation unit 23, an elevating shaft is inserted through a central hollow portion of the rotation shaft 27 and table 28 and can be vertically movable. A circular plate-shaped elevating plate 32 is mounted on an upper portion of the elevating shaft 31. At a periphery of the elevating plate 32, a multiple number of elevating pins 33 for moving up and down the substrate 2, while being in contact with a rear surface of the substrate 2, are provided at regular intervals along a circumference of the elevating plate 32. The elevating shaft 31 is connected to an elevating unit 34. The elevating unit 34 moves up and down the elevating shaft 31 and the elevating plate 32 to move up and down the substrate 2 held by the elevating pins 33 provided at the elevating plate 32. The substrate 2 is received by the substrate holding members 29 of the table 28 from the substrate transfer device 10 or transferred from the substrate holding members 29 to the substrate transfer device 10. The elevating unit 34 is connected to the controller 26, and its elevating operation is controlled by the controller 26.

The processing solution supply unit 24 includes a first processing solution discharge unit 35 that supplies an acid processing solution; a second processing solution discharge unit 36 that supplies an alkaline processing solution; and a third processing solution discharge unit 37 that supplies an organic processing solution. The processing solution supply unit 24 can selectively supply multiple kinds of processing solutions (herein, three kinds of processing solutions including the acid processing solution, the alkaline processing solution, and the organic processing solution) to the substrate 2.

The first to third processing solution discharge units 35, 36, and 37 have the same configuration. Each of arms 38, 39, and 40 is provided above the table 28 to be horizontally moved. Each of nozzles 41, 42, and 43 is provided at a front end of each of the arms 38, 39, and 40, respectively. Each of rotation shafts 44, 45, and 46 is provided at a base end of each of the arms 38, 39, and 40, respectively. The rotation shafts 44, 45, and 46 are connected to rotation driving devices 47, 48, and 49, respectively. By the respective rotation driving devices 47, 48, and 49, the arms 38, 39, and 40 and the nozzles 41, 42, and 43 are horizontally moved between a retreated position above an outside of the substrate 2 and a starting position above a central portion of the substrate 2. The rotation driving devices 47, 48, and 49 are connected to the controller 26, and its moving operation is individually controlled by the controller 26.

In the first to third processing solution discharge units 35, 36, and 37, the nozzles 41, 42, and 43 are connected to first to third processing solution supply sources 50, 51, and 52 via flow rate controllers 53, 54, and 55, respectively. A flow rate of a processing solution discharged from any one of the nozzles 41, 42, and 43 can be controlled by the respective flow rate controllers 53, 54, and 55. The flow rate controllers 53, 54, and 55 are connected to the controller 26, and the controller 26 is configured to control an opening/closing operation of the flow rate controllers 53, 54, and 55 and a flow rate control thereof. Therefore, the processing solution is selectively discharged from any one of the nozzles 41, 42, and 43 to the substrate 2.

Figure 3:
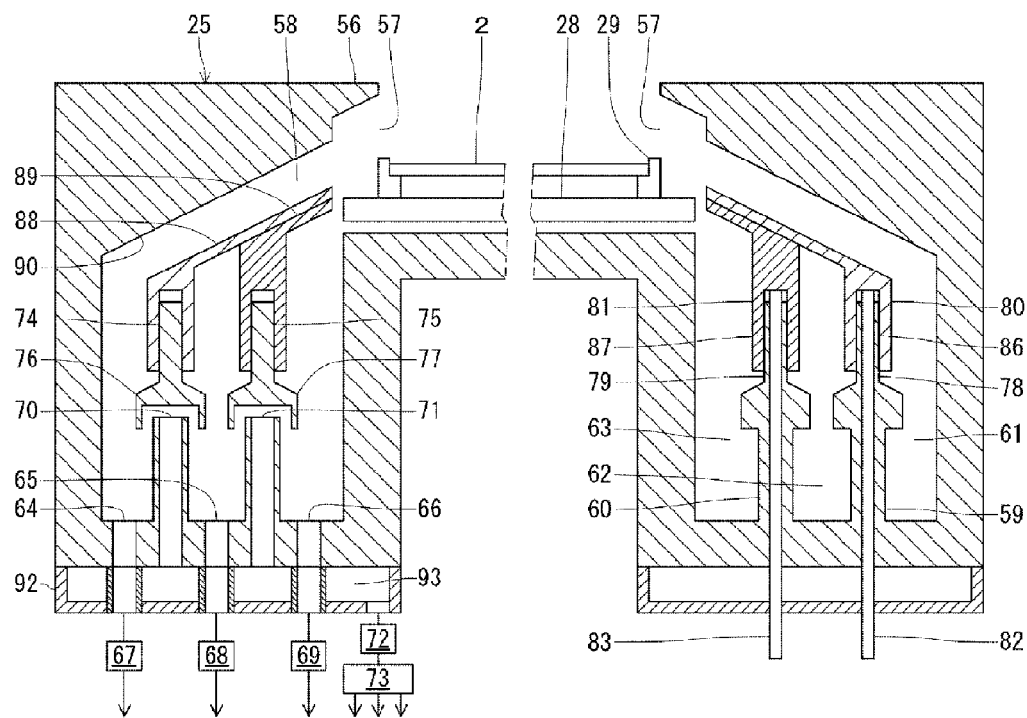
FIG. 3 is an enlarged cross sectional side view illustrating a collection cup.

As depicted in FIGS. 2 and 3, the processing solution collection unit 25 surrounds a lower area and an outer peripheral area of the substrate 2 (table 28). Further, a collection cup 56 is fixed to the substrate processing chamber 11 and disposed such that an upper are of the substrate 2 (table 28) is opened. Further, a peripheral area of the substrate 2, which is surrounded by the collection cup 56, forms the processing space (PS). The collection cup 56 is not limited to be directly fixed to the substrate processing chamber 11 and may be fixed thereto via a fixing member.

The collection cup 56 includes a collection opening at the outer peripheral area of the substrate 2 (table 28) and a collection space 58 that communicates with the collection opening 57 at the lower portion of the collection opening 57.

The collection cup 56 includes concentric double ring-shaped first and second partition walls 59 and 60 at a bottom portion of the collection space 58. As a result, the bottom portion of the collection space 58 is divided into concentric triple ring-shaped first to third liquid collection regions 61, 62, and 63. At a bottom portion of the first to third liquid collection regions 61, 62, and 63, first to third liquid drain openings 64, 65, and 66 are respectively provided with a space therebetween in a diametrical direction thereof. The first to third liquid drain openings 64, 65, and 66 are connected to liquid drain pipes (not illustrated) via suction units 67, 68, and 69, respectively. The suction units 67, 68, and 69 are individually controlled by the controller 26. Further, the liquid drain pipes may be connected to liquid drain lines of factory facilities, so that the processing solution can be discharged under its own weight.

The collection cup 56 includes first and second exhaust openings 70 and 71 between the first and second liquid drain openings 64 and 65 and between the second and third liquid drain openings 65 and 66, respectively, with a space therebetween in a diametrical direction thereof. Further, the first and second exhaust openings 70 and 71 are provided in the middle of the first and second partition walls 59 and 60 and arranged above the first to third liquid drain openings 64, 65, and 66. At a bottom portion of the collection cup 56, a hollow exhaust casing 92 is provided, and a connection path 93 for communicating with the first and second exhaust openings 70 and 71 is provided. The first and second exhaust openings 70 and 71 are connected to an exhaust pipe (not illustrated) via a suction unit 72 connected to the connection path 93 and an exhaust switching valve 73 connected to the suction unit 72. The suction unit and the exhaust switching valve 73 are individually controlled by the controller 26. The exhaust pipe may be connected to the liquid drain lines of factory facilities, so that the processing solution can be discharged by means of suction of the liquid drain lines. Alternatively, each of the first and second exhaust openings 70 and 71 may be directly connected to a suction unit. The first and second exhaust openings 70 and 71 may be arranged along the entire periphery of the collection cup 56.

The collection cup 56 includes first and second fixed covers 74 and 75 with a space therebetween right above the first and second exhaust openings 70 and 71 in the middle of the first and second partition walls 59 and 60. Both sides of the first and second fixed covers 74 and 75 respectively form cover members 76 and 77 which are protruded outwards and downwards to cover upper portions and side portions of the first and second exhaust openings 70 and 71. Further, the collection cup 56 includes circular ring-shaped supporting protrusions 78 and 79 formed by upwardly extending upper portions of the first and second fixed covers 74 and 75. As separate bodies from the collection cup 56, the first and second fixed covers 74 and 75 are fixed to the collection cup 56 directly, or via a fixing member.

In the collection cup 56, first and second elevating cups 80 and 81 are provided above the first and second partition walls 59 and 60 (above the first and second fixed covers 74 and 75), respectively. The first and second elevating cups 80 and 81 are respectively connected to first and second elevating rods 82 and 83 which are inserted through the first and second partition walls 59 and 60 and can be vertically moved. The first and second elevating rods 82 and 83 are connected to first and second cup elevating units 84 and 85, respectively. The first and second elevating cups 80 and 81 and the first and second elevating rods 82 and 83 are connected with each other by, for example, magnetic force, and can be moved up and down as a single unit. The first and second cup elevating units 84 and 85 are connected to the controller 26, and its elevating operation is individually controlled by the controller 26.

The first and second elevating cups 80 and 81 respectively include circular ring-shaped supporting recesses 86 and 87 which are extended downwards at a lower end thereof. The supporting recesses 86 and 87 respectively cover the supporting protrusions 78 and 79 of the first and second fixed covers 74 and 75 of the collection cup 56. Further, inclined walls 88 and 89, which are inclined toward an inner and upper area of the collection opening 57 of the collection cup 56. The supporting recesses 86 and 87 and the supporting protrusions 78 and 79 are provided such that lower ends of the supporting recesses 86 and 87 are positioned to be lower than the upper ends of the supporting protrusions 78 and 79 even if the first and second elevating cups 80 and 81 are moved up. In the first elevating cup 80, the inclined wall 88 is extended to the collection opening 57 of the collection cup 56 along and in parallel with an inclined wall 90 of the collection space 58. The inclined wall 88 is provided to be close to the inclined wall 90 of the collection space 58 of the collection cup 56. In the second elevating cup 81, the inclined wall 89 is extended to the collection opening 57 of the collection cup 56 along and in parallel with the inclined wall 88 of the first elevating cup 80. The inclined wall 89 located below the inclined wall 88 is provided to be close to the inclined wall 88.

Figure 5:
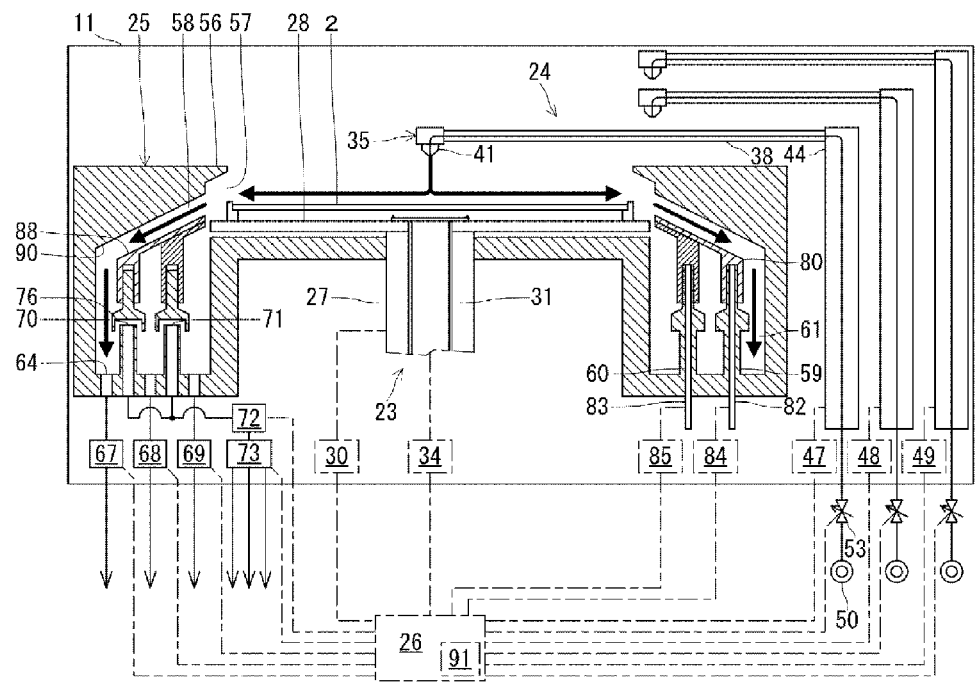
FIG. 5 is an explanatory diagram illustrating an operation in the substrate processing chamber (acid processing solution)

If the first and second elevating cups 80 and 81 are moved down by driving the first and second cup elevating units 84 and 85, there is formed a flow path from the collection opening 57 to the first liquid drain opening 64 of the first liquid collection region 61 between the inclined wall 90 of the collection cup 56 and the inclined wall 88 of the first elevating cup 80 within the collection space 58 (see FIG. 5). If the first elevating cup 80 is moved up and the second elevating cup 81 is moved down by driving the first and second cup elevating units 84 and 85, there is formed a flow path from the collection opening 57 to the second liquid drain opening 65 of the second liquid collection region 62 between the inclined wall 88 of the first elevating cup 80 and the inclined wall 89 of the second elevating cup 81 within the collection space 58 (see FIG. 6). If the first and second elevating cups 80 and 81 are moved up by driving the first and second cup elevating units 84 and 85, there is formed a flow path from the collection opening 57 to the third liquid drain opening 66 of the third liquid collection region 63 below the inclined wall 89 of the second elevating cup 81 within the collection space 58 (see FIG. 7).

Figure 4:
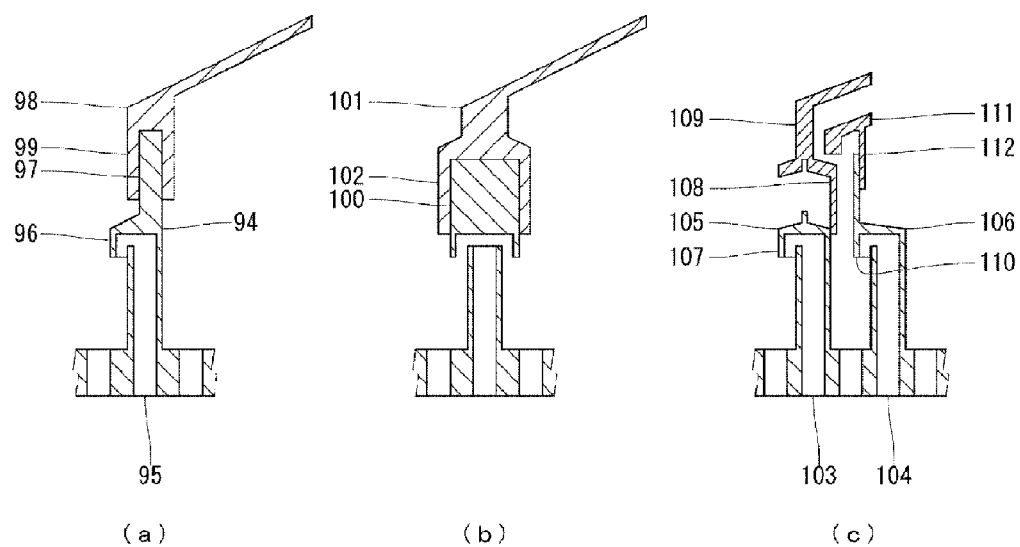
FIG. 4 is a cross sectional side view illustrating a fixed cover.

As depicted in FIG. 4(*a*), a fixed cover 94 provided at the collection cup 56 may form a cover member 96 downwardly extended in a folded shape on any one side of an exhaust opening 95. Further, a supporting protrusion 97 may be formed above the cover member 96, and a supporting recess 99 provided at a lower end of an elevating cup 98 may cover the supporting protrusion 97.

As depicted in FIG. 4(*b*), a supporting recess 102 provided at a lower end of an elevating cup 101 may cover the entire upper portion of a fixed cover 100.

As depicted in FIG. 4(*c*), first and second fixed covers 105 and 106 respectively provided above first and second exhaust openings 103 and 104 may be formed in different shapes from each other. The first and second exhaust openings 103 and 104 are opened along the entire periphery of the collection cup 56. The first fixed cover 105 is fixed to an inner peripheral side of the first exhaust opening 103 (to the rotation shaft 27's side) and includes a cover member 107 downwardly formed in a folded shape at an outer peripheral side of the first exhaust opening 103. The first fixed cover 105 is fixed to the inner peripheral side of the first exhaust opening 103 without a gap therebetween directly or via a fixing member. A first elevating cup 109 including a recess 108 at its lower end is provided above the first fixed cover 105. Only an inner peripheral side of the recess 108 of the first elevating cup 109 is extended downwards. Even if the first elevating cup 109 is moved up, a lower end of the recess 108 is positioned to be lower than an upper end of the first fixed cover 105. As a result, it is possible to prevent the first elevating cup 109 from being separated from the first fixed cover 105.

The second fixed cover 106 is fixed to an inner peripheral side of the second exhaust opening 104 and includes a cover member 110 downwardly formed in a folded shape at an outer peripheral side of the second exhaust opening 104. An upper portion of the cover member 110 is extended toward an upper portion of the second fixed cover 106. The second fixed cover 106 is fixed to the inner peripheral side of the second exhaust opening 104 without a gap therebetween directly or via a fixing member. A second elevating cup 111 is provided above the second fixed cover 106. The second elevating cup 111 includes a shielding member 112 extended downwards. Accordingly, even if the second elevating cup 111 is moved up, a lower end of the shielding member 112 is positioned to be lower than an upper end of the cover member 110 extended toward the upper portion of the second fixed cover 106. As a result, it is possible to prevent the second elevating cup 111 from being separated from the second fixed cover 106.

The substrate liquid processing apparatus 1 is configured as described above, and processes the substrate 2 with the processing solutions in each of the substrate processing chambers 11 to 22 according to a substrate liquid processing program stored in a storage medium 91 which can be read out by the controller 26 (computer). Further, the storage medium 91 may store various programs such as a substrate liquid processing program, and may include a semiconductor memory-type storage medium, such as a ROM or a RAM, or a disk-type storage medium, such as a hard disk or a CD-ROM.

Further, in the substrate liquid processing apparatus 1, when the substrate 2 is processed with the processing solution, the processing solution supply unit 24 selectively switches a kind of the processing solution to be supplied to the substrate 2. Depending on the kind of the processing solution, the first and second elevating cups 80 and 81 of the processing solution collection unit 25 are individually moved up and down, so that the processing solution is discharged through any one of the first to third liquid drain openings 64, 65, and 66. At the same time, gas-liquid separation is carried out within the collection cup 56 and the gas is discharged through the first and second exhaust openings 70 and 71.

By way of example, in the substrate liquid processing apparatus 1, when performing a liquid process on the substrate 2 by discharging the acid processing solution to the substrate 2 from the first processing solution discharge unit 35 of the processing solution supply unit 24, as depicted in FIG. 5, the controller 26 controls the rotation driving device 30 to rotate the table 28 of the substrate rotation unit 23 and the substrate 2 held by the substrate holding members 29 of the table 28 at a certain rotation speed. While rotating the table 28 and the substrate 2, the controller 26 controls an opening and a flow rate of the flow rate controller 53 to discharge the acid processing solution supplied from the first processing solution supply source 50 to the upper surface of the substrate 2 through the nozzle 41.

In this case, in the substrate liquid processing apparatus 1, the controller 26 controls the first and second cup elevating units 84 and 85 to move down the first and second elevating cups 80 and 81. Thus, the flow path is formed from the collection opening 57 to the first liquid drain opening 64 of the first liquid collection region 61. Further, in the substrate liquid processing apparatus 1, the controller 26 controls the suction unit 67 connected to the first liquid drain opening 64 and the suction unit 72 connected to the first and/or second exhaust openings 70 and/or 71 to be driven. Further, the exhaust switching valve 73 is switched into an acid gas exhaust path.

Then, the acid processing solution supplied to the substrate 2 is dispersed toward the outer peripheral portion of the substrate 2 by centrifugal force caused by the rotation of the substrate 2. Then, the acid processing solution and an atmosphere around the substrate 2 are collected together into the first liquid collection region 61 of the collection space 58 from the collection opening 57 of the collection cup 56 by suction force of the suction units 67 and 72. The collected acid processing solution and atmosphere are separated from each other in the first liquid collection region 61, and the acid processing solution in a liquid form is discharged to the outside from the first liquid drain opening 64 through the suction unit 67. Further, the atmosphere in a gaseous form is discharged to the outside from the first and second exhaust openings 70 and/or 71 through the suction unit 72 and the exhaust switching valve 73.

Figure 6:
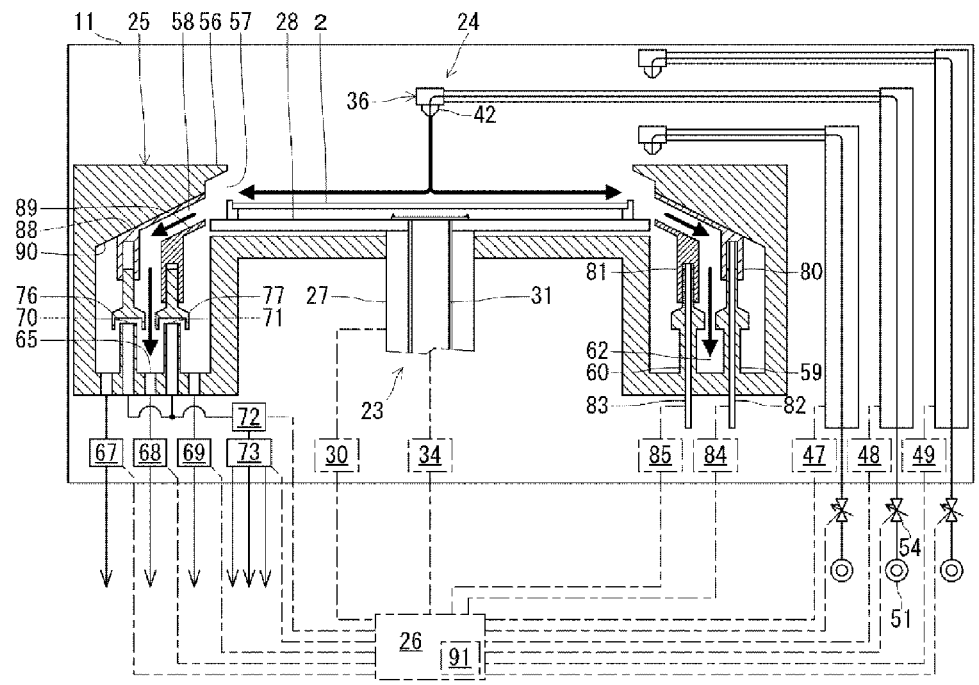
FIG. 6 is an explanatory diagram illustrating an operation in the substrate processing chamber (alkaline processing solution)

In the substrate liquid processing apparatus 1, when performing a liquid process on the substrate 2 by discharging the alkaline processing solution to the substrate 2 from the second processing solution discharge unit 36 of the processing solution supply unit 24, as depicted in FIG. 6, the controller 26 controls an opening and a flow rate of the flow rate controller 54 to discharge the alkaline processing solution supplied from the second processing solution supply source 51 to the upper surface of the substrate 2 through the nozzle 42. In this case, in the substrate liquid processing apparatus 1, the controller 26 controls the first cup elevating unit 84 to move up only the first elevating cup 80. Thus, the flow path is formed from the collection opening 57 to the second liquid drain opening 65 of the second liquid collection region 62. Further, the controller 26 controls the suction unit 68 connected to the second liquid drain opening 65 and the suction unit 72 connected to the first and/or second exhaust openings 70 and/or 71 to be driven. Further, the exhaust switching valve 73 is switched into an alkaline gas exhaust path. The alkaline processing solution supplied to the substrate 2 and an atmosphere around the substrate 2 are collected together into the second liquid collection region 62 of the collection space 58 from the collection opening 57 of the collection cup 56. The collected alkaline processing solution and atmosphere are separated from each other in the second liquid collection region 62, and the alkaline processing solution in a liquid form is discharged to the outside from the second liquid drain opening 65 through the suction unit 68. Further, the atmosphere in a gaseous form is discharged to the outside from the first and/or second exhaust openings 70 and/or 71 through the suction unit 72 and the exhaust switching valve 73.

Figure 7:
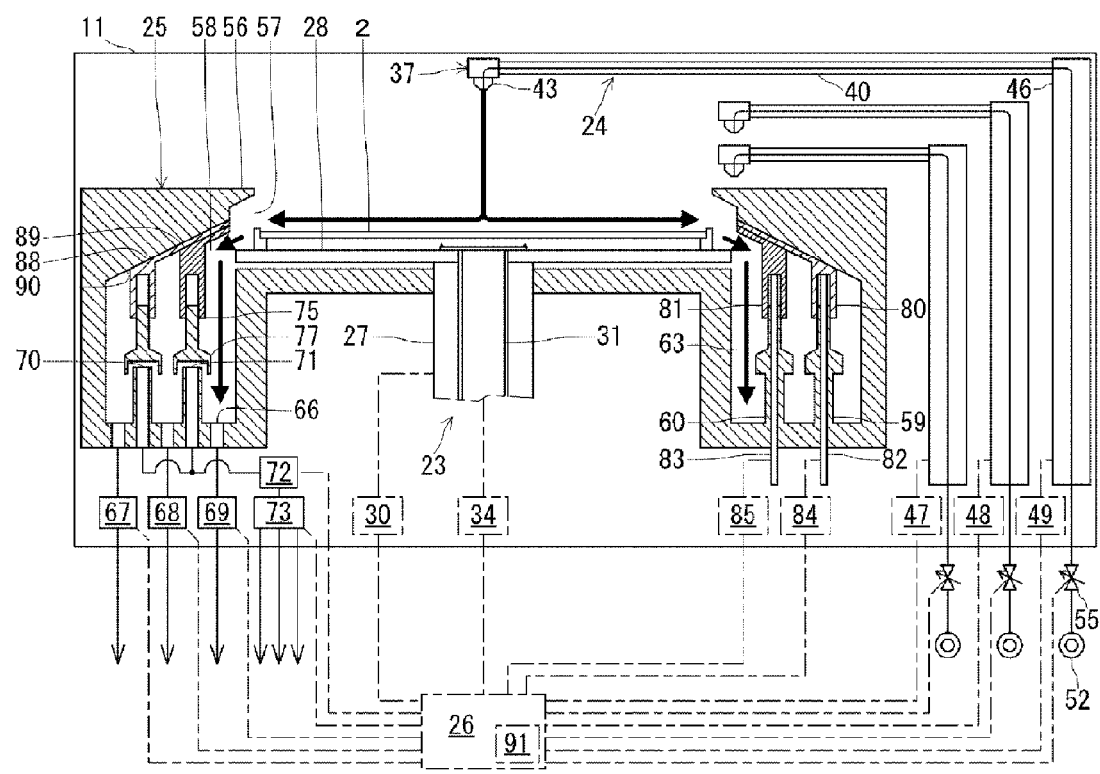
FIG. 7 is an explanatory diagram illustrating an operation in the substrate processing chamber (organic processing solution).

In the substrate liquid processing apparatus 1, when performing a liquid process on the substrate 2 by discharging the organic processing solution to the substrate from the third processing solution discharge unit 37 of the processing solution supply unit 24, as depicted in FIG. 7, the controller 26 controls an opening and a flow rate of the flow rate controller 55 to discharge the organic processing solution supplied from the third processing solution supply source 52 to the upper surface of the substrate 2 through the nozzle 43. In this case, in the substrate liquid processing apparatus 1, the controller 26 controls the first and second cup elevating units 84 and 85 to move up the first and second elevating cups 80 and 81. Thus, the flow path is formed from the collection opening 57 to the third liquid drain opening 66 of the third liquid collection region 63. Further, the controller 26 controls the suction unit 69 connected to the third liquid drain opening 66 and the suction unit 72 connected to the first and/or second exhaust openings 70 and/or 71 to be driven. Further, the exhaust switching valve 73 is switched into an organic gas exhaust path. The organic processing solution supplied to the substrate 2 and an atmosphere around the substrate 2 are collected together into the third liquid collection region 63 of the collection space 58 from the collection opening 57 of the collection cup 56. The collected organic processing solution and atmosphere are separated from each other in the third liquid collection region 63, and the organic processing solution in a liquid form is discharged to the outside from the third liquid drain opening 66 through the suction unit 69. Further, the atmosphere in a gaseous form is discharged to the outside from the first and/or second exhaust openings 70 and/or 71 through the suction unit 72 and the exhaust switching valve 73.

As described above, the substrate liquid processing apparatus 1 includes the substrate rotation unit 23 for holding the substrate 2 and rotating the held substrate 2; the processing solution supply unit 24 for selectively supplying the multiple kinds of processing solutions toward the substrate 2; and the processing solution collection unit for collecting the processing solution supplied to the substrate 2.

The processing solution collection unit 25 includes the collection cup 56 for collecting the processing solution supplied to the substrate 2; the collection opening 57 formed at the collection cup 56 in order to collect the processing solution; the liquid drain openings (first to third liquid drain openings 64, 65, and 66) formed at the collection cup 56 in order to discharge the processing solution collected through the collection opening 57; the exhaust openings (first and second exhaust openings 70 and 71) formed above the liquid drain openings (first to third liquid drain openings 64, 65, and 66) of the collection cup 56; the fixed covers (first and second fixed covers 74 and 75) fixed to the collection cup 56 to cover the upper portion of the exhaust openings (first and second exhaust openings 70 and 71) with a space therebetween; the elevating cups (first and second elevating cups 80 and 81) provided at the collection cup 56 to be movable vertically; and the cup elevating units (first and second cup elevating units 84 and 85) for moving up and down the elevating cups (first and second elevating cups 80 and 81) depending on the kinds of the processing solutions. The liquid drain opening, the exhaust opening, the fixed cover, the elevating cup, and the cup elevating unit are, but not limited to, plural in number and may be singular in number.

In accordance with the illustrative embodiment, the substrate liquid processing apparatus 1 configured as described above can separate the processing solution and the atmosphere from each other within the collection cup 56 through the liquid drain opening and the exhaust opening formed at the collection cup 56. Thus, a gas-liquid separation device additionally installed to the collection cup 56 is not required. Therefore, even if the multiple kinds of processing solutions are selectively supplied to the substrate 2 depending on a liquid process performed on the substrate 2, the substrate liquid processing apparatus 1 can be miniaturized.

If the gas-liquid separation can be carried out within the collection cup 56, when the elevating cup is moved up and down right above the exhaust opening depending on the kinds of the processing solutions, an effective cross sectional area of the flow path connected to the exhaust opening is changed, so that an exhaust pressure may be changed or the processing solution adhering to the elevating cup may be introduced into the exhaust opening. In accordance with the substrate liquid processing apparatus 1 configured as described above, the fixed covers (first and second fixed covers 74 and 75) are provided above the exhaust openings (first and second exhaust openings 70 and 71), so that even if the elevating cups (first and second elevating cups 80 and 81) are moved up and down, it is possible to prevent the exhaust pressure change and the introduction of the processing solution. Therefore, the processing solution and the atmosphere can be separated and discharged efficiently.

Further, in the substrate liquid processing apparatus 1, the respective liquid drain openings (first to third liquid drain openings 64, 65, and 66) used depending on the kinds of the processing solutions to be supplied to the substrate 2 are provided. Furthermore, the elevating cups (first and second elevating cups 80 and 81) are moved up and down by driving the cup elevating units (first and second cup elevating units 84 and 85), so that any one of the liquid drain openings (first to third liquid drain openings 64, 65, and 66) communicates with the collection opening 57. Therefore, depending on the kinds of the processing solutions, the elevating cups (first and second elevating cups 80 and 81) are moved up and down, and the processing solutions are separately collected. Accordingly, it is possible to prevent the different kinds of processing solutions from being mixed and reacted together.

Furthermore, in the substrate liquid processing apparatus 1, even if the first and second elevating cups 80 and 81 are moved up, the lower ends of the supporting recesses 86 and 87 are positioned to be lower than the upper ends of the supporting protrusions 78 and 79. Thus, it is possible to divide the flow paths through which the processing solutions are collected into the liquid collection regions 61, 62, and 63 more accurately, and it is also possible to separately collect the processing solutions depending on the kinds of the processing solutions.

Moreover, in the substrate liquid processing apparatus 1, the fixed covers 105 and 106 are fixed on one side (for example, the inner peripheral side (the rotation shaft 27's side)) of the exhaust openings 103 and 104 without a gap therebetween. Further, the cover members 107 and 110 downwardly formed in a folded shape are provided on the other side (for example, the outer peripheral side) of the exhaust openings 103 and 104 (see FIG. 4(c)). Thus, the exhaust openings 103 and 104 can be provided at each liquid collection region. Therefore, depending on the kinds of the processing solutions, the atmospheres as well as the processing solutions can be separately discharged. In the substrate liquid processing apparatus 1, the fixed covers 105 and 106 are fixed on one side of the exhaust openings 103 and 104 without a gap therebetween. Further, the lower end of the recess 108 or the shielding member 112 is positioned to be lower than upper ends of the fixed covers 105 and 106 even if the elevating cups 109 and 111 are moved up, so that the elevating cups 109 and 111 are not separated from the fixed covers 105 and 106. Thus, it is possible to prevent the processing solutions and the atmospheres from being introduced into the liquid collection regions or exhaust openings located nearby. Therefore, the processing solutions and the atmospheres can be separately discharged more accurately depending on the kinds of the processing solutions.

What is claimed is:

1. A substrate liquid processing apparatus configured to perform a liquid process on a substrate with a processing solution, the substrate liquid processing apparatus comprising:
    a substrate rotation unit configured to hold and rotate a substrate within a processing space;
    a processing solution supply unit configured to selectively supply plural kinds of processing solutions to the substrate;
    a collection cup configured to collect the processing solutions supplied to the substrate;
    a plurality of liquid collection regions formed at the collection cup and configured to collect the processing solutions;
    at least one liquid drain opening formed at a bottom portion of the collection cup and configured to discharge the processing solutions collected in the liquid collection regions;
    at least one exhaust opening formed above the at least one liquid drain opening of the collection cup;
    at least one fixed cover fixed to the collection cup and configured to cover an upper portion of the at least one exhaust opening with a predetermined space therebetween, such that the at least one exhaust opening is entirely covered by the at least one fixed cover when viewed from above;
    at least one elevating cup provided above the at least one fixed cover and configured to guide the processing solutions supplied to the substrate into the liquid collection regions; and
    at least one cup elevating unit configured to move up and down the at least one elevating cup with respect to the at least one fixed cover depending on the kinds of the processing solutions,
    wherein the at least one fixed cover is includes at least one supporting protrusion at a top portion thereof,
    the at least one elevating cup includes at least one supporting recess at a bottom portion thereof, and
    the at least one supporting protrusion of the at least one fixed cover is configured to be inserted into the at least one supporting recess of the at least one elevating cup, and
    the predetermined space between the at least one fixed cover and the at least one exhaust opening is maintained constant when the at least one elevating cup moves up and down.

2. The substrate liquid processing apparatus of claim 1, wherein the at least one liquid drain opening is plural in number, the liquid drain openings are respectively formed at bottom portions of the liquid collection regions, and the number of the liquid drain openings corresponds to the number of the kinds of the processing solutions supplied from the processing solution supply unit.

3. The substrate liquid processing apparatus of claim 2, wherein the at least one cup elevating unit moves up and down the at least one elevating cup, so that the processing space communicates with one of the liquid drain openings.

4. The substrate liquid processing apparatus of claim 1, wherein when the at least one elevating cup is moved up, a lower end of the at least one supporting recess is positioned to be lower than an upper end of the at least one fixed cover.

5. The substrate liquid processing apparatus of claim 1, wherein at least one cover member protruding toward an upper area and a side area of the at least one exhaust opening is provided at the at least one fixed cover.

6. The substrate liquid processing apparatus of claim 1, wherein the at least one exhaust opening is plural in number, and the exhaust openings communicate with each other at a bottom portion of the collection cup.

7. The substrate liquid processing apparatus of claim 1, wherein the at least one exhaust opening is provided between adjacent the liquid collection regions.

8. The substrate liquid processing apparatus of claim 1, wherein the liquid collection regions are partitioned by at least one partition wall at which the at least one exhaust opening is formed.

* * * * *